(12) United States Patent
Takahashi et al.

(10) Patent No.: US 12,219,694 B2
(45) Date of Patent: Feb. 4, 2025

(54) BATTERY WIRING MODULE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Hideo Takahashi, Mie (JP); Shinichi Takase, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 234 days.

(21) Appl. No.: 17/773,946

(22) PCT Filed: Sep. 30, 2020

(86) PCT No.: PCT/JP2020/037166
§ 371 (c)(1),
(2) Date: May 3, 2022

(87) PCT Pub. No.: WO2021/095388
PCT Pub. Date: May 20, 2021

(65) Prior Publication Data
US 2022/0377881 A1    Nov. 24, 2022

(30) Foreign Application Priority Data

Nov. 13, 2019   (JP) ................................. 2019-205196

(51) Int. Cl.
*H05K 1/02*       (2006.01)
*G01R 31/385*     (2019.01)
(Continued)

(52) U.S. Cl.
CPC ......... *H05K 1/0268* (2013.01); *G01R 31/385* (2019.01); *H01M 10/482* (2013.01);
(Continued)

(58) Field of Classification Search
CPC .... H05K 1/0268; H05K 1/028; H05K 1/0298; H05K 1/115; H05K 1/189; G01R 31/385;
(Continued)

(56) References Cited

U.S. PATENT DOCUMENTS

2015/0137824 A1    5/2015   Nishihara
2018/0358820 A1*  12/2018   Mizoguchi ............ H02J 7/0048
2019/0198944 A1*   6/2019   Tanabe ................ H01M 50/581

FOREIGN PATENT DOCUMENTS

JP     09-181453      7/1997
JP     2001-068856    3/2001
(Continued)

OTHER PUBLICATIONS

Multilayer flexible board (Year: 2011).*
(Continued)

*Primary Examiner* — Ishwarbhai B Patel
(74) *Attorney, Agent, or Firm* — Greenblum & Bernstein, P.L.C.

(57) ABSTRACT

A battery wiring module includes a plurality of connecting members to be connected to electrode terminals and a flexible printed circuit board having a plurality of voltage detection lines for detecting the voltages of a plurality of power storage elements via the plurality of connecting members, at least one of the plurality of voltage detection lines being constituted to include a front surface wiring and a back surface wiring respectively formed on a front surface and a back surface of the flexible printed circuit board, and a front-back conduction part passing through the flexible printed circuit board in the plate thickness direction and
(Continued)

connecting the front surface wiring and the back surface wiring, and the resistance value per unit length of the front-back conduction part being less than or equal to the maximum resistance value per unit length of the front surface wiring and the back surface wiring.

5 Claims, 4 Drawing Sheets

(51) Int. Cl.
| | |
|---|---|
| *H01M 10/48* | (2006.01) |
| *H01M 50/209* | (2021.01) |
| *H01M 50/298* | (2021.01) |
| *H01M 50/519* | (2021.01) |
| *H01M 50/569* | (2021.01) |
| *H05K 1/11* | (2006.01) |
| *H05K 1/18* | (2006.01) |

(52) U.S. Cl.
CPC ....... *H01M 50/209* (2021.01); *H01M 50/298* (2021.01); *H01M 50/519* (2021.01); *H01M 50/569* (2021.01); *H05K 1/028* (2013.01); *H05K 1/0298* (2013.01); *H05K 1/115* (2013.01); *H05K 1/18* (2013.01); *H05K 1/189* (2013.01)

(58) Field of Classification Search
CPC ............. H01M 10/482; H01M 50/209; H01M 50/298; H01M 50/519; H01M 50/569; H01M 2220/20; H01M 10/48; H01M 50/284; H01M 50/507; H01M 2010/4271; H01M 10/425; H01M 50/20; H01M 50/50; H01M 50/516; H01M 50/522; Y02E 60/10; H01G 2/06; H01G 4/38; H01G 11/10

See application file for complete search history.

(56) References Cited

FOREIGN PATENT DOCUMENTS

| | | | |
|---|---|---|---|
| JP | WO2011129127 A | * | 10/2011 |
| JP | WO2014064997 | * | 5/2014 |
| JP | 2017-045845 | | 3/2017 |
| JP | 2019-114464 | | 7/2019 |
| WO | 2014/024452 | | 2/2014 |

OTHER PUBLICATIONS

Flexible printed circuit board (Year: 2014).*
International Search Report issued in International Bureau of WIPO Patent Application No. PCT/JP2020/037166, dated Dec. 15, 2020, along with an English translation thereof.

* cited by examiner

FIG. 2
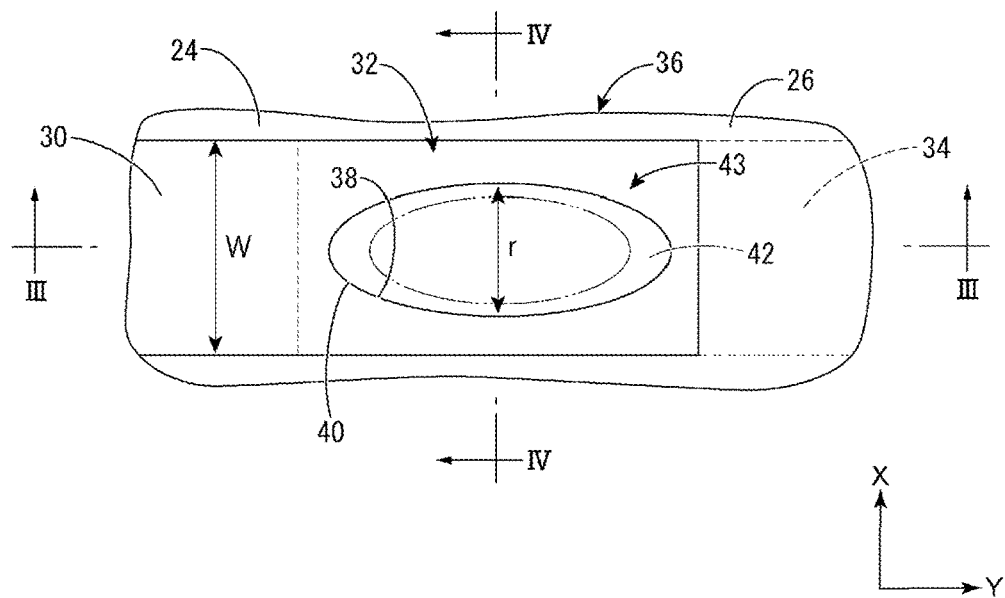
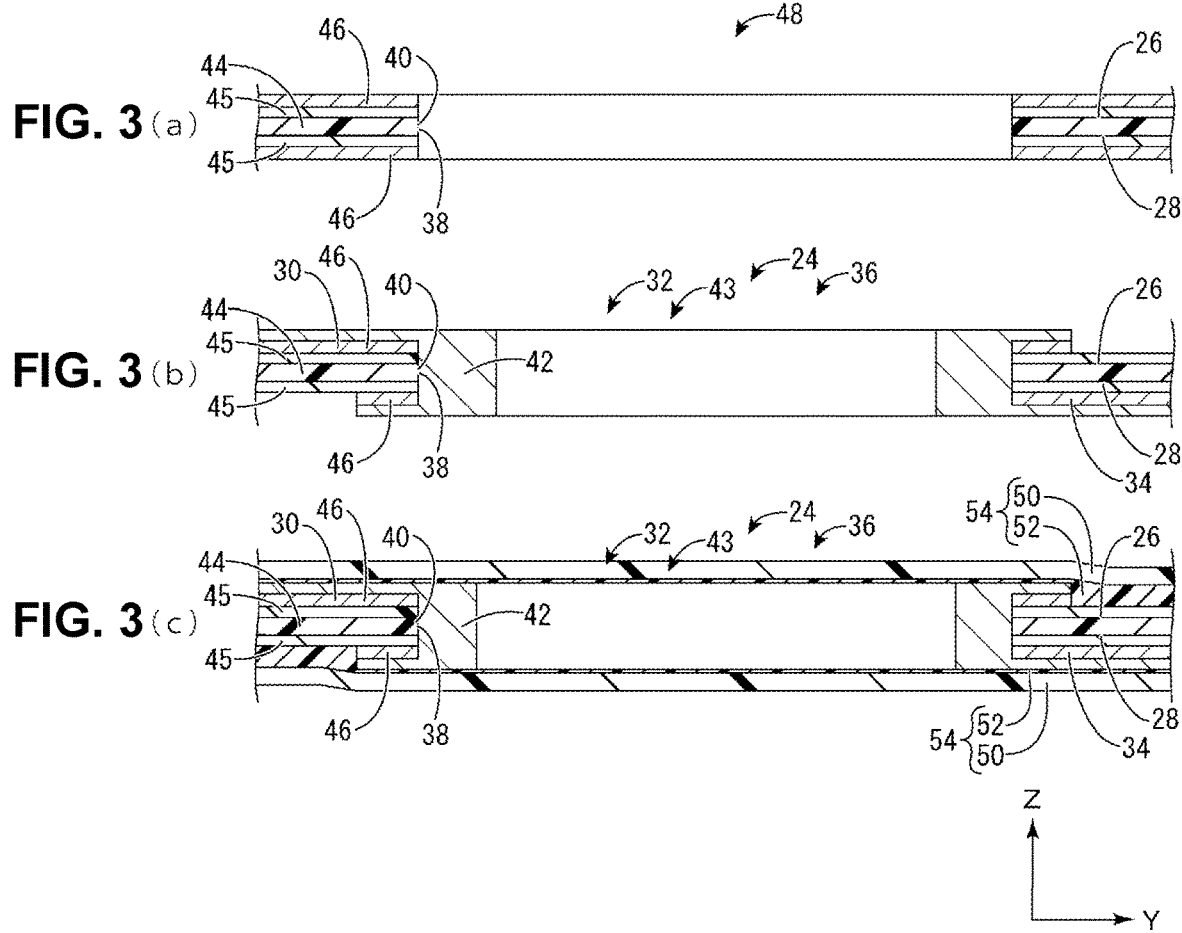

BATTERY WIRING MODULE

TECHNICAL FIELD

The present disclosure relates to a battery wiring module to be attached to a plurality of power storage elements.

BACKGROUND ART

In power storage modules for electric cars and hybrid cars, a plurality of power storage elements are connected in series or in parallel. A battery wiring module including a plurality of connecting members that are connected to electrode terminals of the power storage elements and a plurality of voltage detection lines for detecting the voltages of the power storage elements is attached to the plurality of power storage elements, and is able to monitor the voltages of the power storage elements.

In recent years, as described in Patent Document 1, for example, battery wiring modules in which the plurality of voltage detection lines are constituted using a plurality of printed wirings of a flexible printed circuit board have been proposed, and improvements in handling and assembly workability of battery wiring modules have been achieved.

CITATION LIST

Patent Documents

Patent Document 1: WO/2014/024452

SUMMARY OF INVENTION

Technical Problem

Incidentally, in the case where the plurality of voltage detection lines are constituted using printed wirings of a flexible printed circuit board, there is an inherent problem in that the degree of freedom in routing the voltage detection lines is restricted, compared with the case where the plurality of voltage detection lines are respectively constituted by different coated wires. To address this problem, it is conceivable to change the wiring configuration using jumper wires, for example. However, the conceivable risk of short circuits via the jumper wires along with other issues make this countermeasure less than ideal.

In view of this, a battery wiring module having a novel structure that is able to improve the degree of freedom in routing of voltage detection lines constituted by printed wirings of a flexible printed circuit board without the accompanying problem of short circuits is disclosed.

Solution to Problem

The battery wiring module of the present disclosure is a battery wiring module to be arranged on a plurality of power storage elements each having an electrode terminal, the battery wiring module including a plurality of connecting members to be connected to the electrode terminals, and a flexible printed circuit board having a plurality of voltage detection lines for detecting voltages of the plurality of power storage elements via the plurality of connecting members, at least one of the plurality of voltage detection lines being constituted to include a front surface wiring and a back surface wiring respectively formed on a front surface and a back surface of the flexible printed circuit board, and a front-back conduction part passing through the flexible printed circuit board in a plate thickness direction and connecting the front surface wiring and the back surface wiring, and a resistance value per unit length of the front-back conduction part being less than or equal to a maximum resistance value per unit length of the front surface wiring and the back surface wiring.

Advantageous Effects of Invention

According to the present disclosure, the degree of freedom in routing of voltage detection lines constituted by printed wirings of a flexible printed circuit board can be improved without the accompanying problem of short circuits.

BRIEF DESCRIPTION OF DRAWINGS

FIG. 2 is an enlarged plan view of a front-back conduction part shown in FIG. 1.

FIGS. 3(a)-3(c) are enlarged cross-sectional views taken along line III-III in FIG. 2 (FIG. 3(a) after through hole formation, FIG. 3(b) after wiring formation, and FIG. 3(c) on completion).

DESCRIPTION OF EMBODIMENTS

Description of Embodiments of Disclosure

Figure 1:
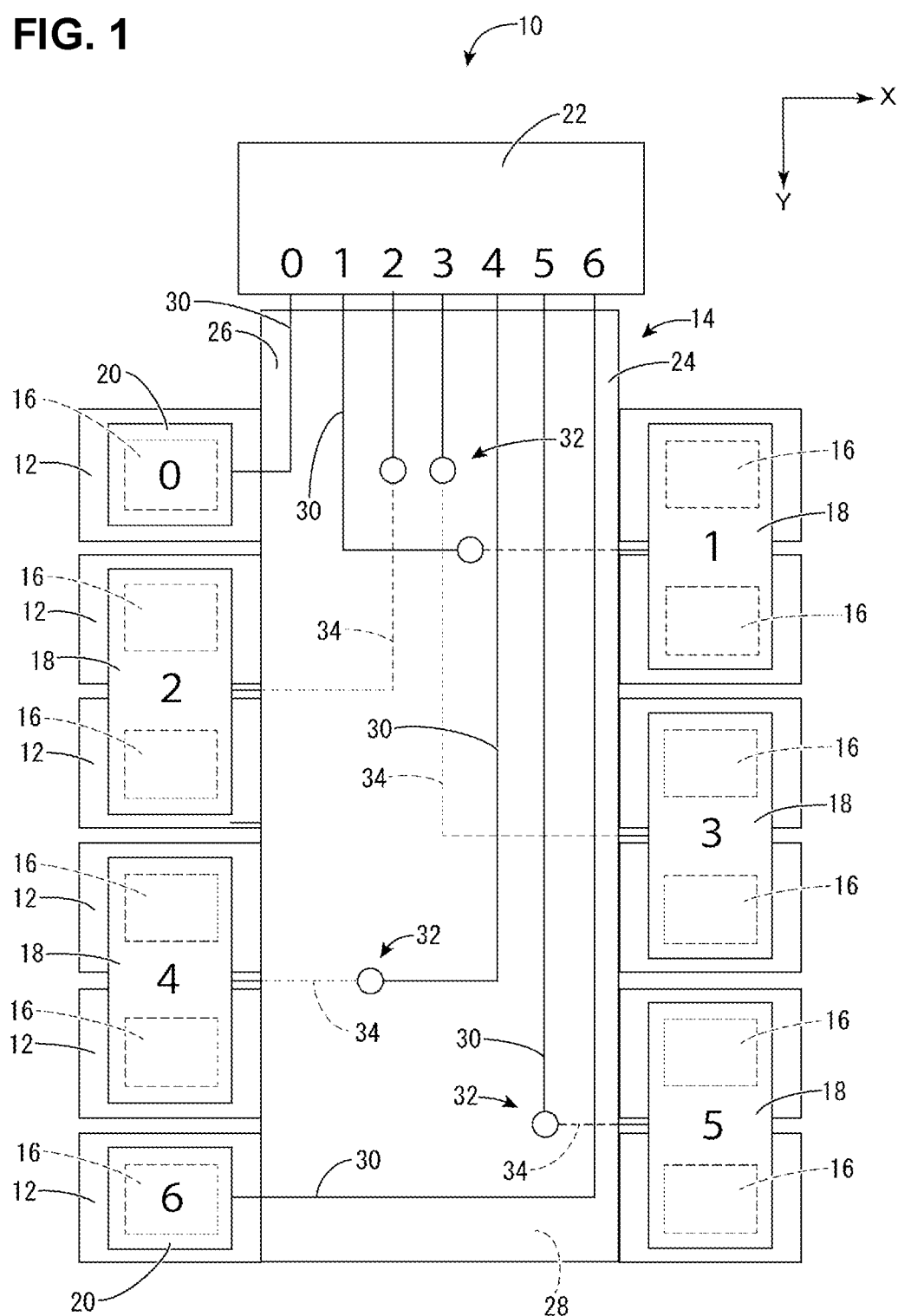
FIG. 1 is a plan view showing a battery wiring module according to a first embodiment of the present disclosure.
Figure 4:
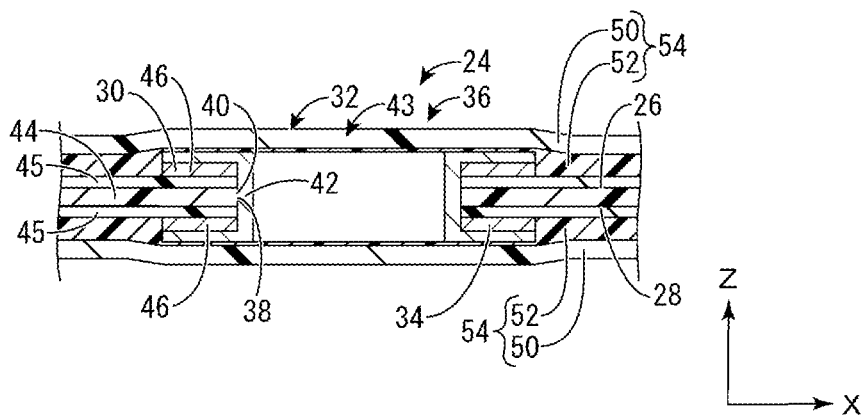
FIG. 4 is an enlarged cross-sectional view taken along line IV-IV in FIG. 2.

Initially, modes for carrying out the disclosure will be enumerated and described.

(1) A battery wiring module of the present disclosure is a battery wiring module to be arranged on a plurality of power storage elements each having an electrode terminal, the battery wiring module including a plurality of connecting members to be connected to the electrode terminals, and a flexible printed circuit board having a plurality of voltage detection lines for detecting voltages of the plurality of power storage elements via the plurality of connecting members, at least one of the plurality of voltage detection lines being constituted to include a front surface wiring and a back surface wiring respectively formed on a front surface and a back surface of the flexible printed circuit board, and a front-back conduction part passing through the flexible printed circuit board in a plate thickness direction and connecting the front surface wiring and the back surface wiring, and a resistance value per unit length of the front-back conduction part being less than or equal to a maximum resistance value per unit length of the front surface wiring and the back surface wiring.

According to the battery wiring module of the present disclosure, at least one of a plurality of voltage detection lines is constituted to include a front surface wiring and a back surface wiring respectively formed on the front surface and the back surface of a flexible printed circuit board, and a front-back conduction part connecting the front and back surface wirings. In the case of wanting to change the order in which the voltage detection lines are arranged at a connector that is connected to an external device to potential order, for example, the desired arrangement can thereby be realized by suitably combining and connecting front surface wirings with back surface wirings via front-back conduction parts.

Furthermore, the resistance value per unit length of the front-back conduction part is set to less than or equal to a maximum resistance value per unit length of the front and back surface wirings, and short circuits and problems such as unexpected circuit breaks of the voltage detection lines occurring in the front-back conduction part are prevented beforehand. The degree of freedom in routing of the voltage detection lines constituted by printed wirings of a flexible printed circuit board can thereby be improved without the accompanying problem of short circuits.

Note that the maximum resistance value per unit length of the front and back surface wirings may be the resistance value of wiring configuration portions of the wirings, and does not include current limiting regions such as chip fuses and positive temperature coefficient thermistors intermediately positioned in the wirings.

(2) Preferably the front-back conduction part has an elliptical shape whose long axis is in a lengthwise direction of the front surface wiring and the back surface wiring. By forming the front-back conduction part in an elliptical shape whose long axis is in the lengthwise direction of the front and back surface wirings, a large cross-sectional area of the front-back conduction part can be secured with respect to the front and back surface wirings whose wiring width is limited. As a result, the resistance value per unit length of the front-back conduction part can be advantageously reduced, and setting this resistance value to less than or equal to the maximum resistance value per unit length of the front and back surface wirings can be easily realized.

(3) Preferably the front-back conduction part is constituted by at least one via consisting of a through hole passing through a multilayer wiring region where the front surface wiring and the back surface wiring overlap each other in projection in the plate thickness direction of the flexible printed circuit board and a metal plating layer adhered to a peripheral wall of the through hole to form a tubular shape and respectively connected, on an upper end side and a lower end side, to the front surface wiring and the back surface wiring. This is because constituting the front-back conduction part with a via enables manufacturing of the battery wiring module of the present disclosure to be advantageously performed.

Note that, apart from a via, the front-back conduction part may be constituted by a through hole that passes, in the plate thickness direction, through the multilayer wiring region where the front and back surface wirings overlap each other and solder that fills the through hole and respectively connects to the front and back surface wirings.

(4) In (3) above, preferably the front-back conduction part is constituted by a plurality of the via adjacently disposed. This is because constituting the front-back conduction part with a plurality of vias disposed adjacently enables a front-back conduction part whose resistance value per unit length is less than or equal to the maximum resistance value per unit length of the front and back surface wirings to be realized without increasing the plating thickness of the vias. Therefore, a front-back conduction part with lower conduction resistance can be provided at lower cost.

(5) In the above (3) or (4), preferably a hole diameter of the through hole constituting the via is larger than a minimum wiring width dimension of the front surface wiring and the back surface wiring. By providing a through hole having a hole diameter larger than the minimum wiring width dimension of the front and back surface wirings in another region where the wiring width dimension is larger, the cross-sectional area of the metal plating layer of the via can be advantageously increased. Therefore, setting the resistance value per unit length of the front-back conduction part constituted by a via to less than or equal to the maximum resistance value per unit length of the front and back surface wirings can be advantageously realized.

(6) In any of the above (3) to (5), preferably the front surface wiring and the back surface wiring are constituted to include a metal base layer provided on the flexible printed circuit board and a surface layer provided on the base layer, the surface layer being formed by plating at the same time as the metal plating layer provided by being adhered to the peripheral wall of the through hole constituting the via, and a thickness dimension of the surface layer being larger than a thickness dimension of the base layer. The surface layer of the front and back surface wirings can be formed by plating at the same time as the metal plating layer provided by being adhered to the peripheral wall of the through hole, and improvement in manufacturing efficiency can be achieved. Furthermore, by making the thickness dimension of the surface layer of the wirings larger than the thickness dimension of the base layer, a large thickness dimension of the metal plating layer of the via can be secured. Therefore, setting the resistance value per unit length of the front-back conduction part constituted by a via to less than or equal to the maximum resistance value per unit length of the front and back surface wirings can be advantageously realized.

(7) Preferably the front surface wiring, the back surface wiring and the front-back conduction part are covered by an insulating film overlaid thereon. This is because the insulating coating can be applied to the front-back conduction part together with the front and back surface wirings, and the occurrence of short circuits due to causes such as condensation on the front-back conduction part can be prevented.

DETAILED DESCRIPTION OF EMBODIMENTS OF DISCLOSURE

Specific examples of a battery wiring module of the present disclosure will be described below with reference to the drawings. Note that the present disclosure is not limited to these illustrative examples and is defined by the claims, and all changes that come within the meaning and range of equivalency of the claims are intended to be embraced therein.

First Embodiment

Hereinafter, a first embodiment of the present disclosure will be described with reference to FIGS. 1 to 4. A power storage module 10 is installed in a vehicle such as an electric car or a hybrid car (not shown), for example, and includes a plurality of power storage elements 12 (six in the present embodiment) and one battery wiring module 14 arranged on the plurality of power storage elements 12. Note that, in the following description, the Z direction is upward, the Y direction is forward in the lengthwise direction, and the X direction is rightward in the widthwise direction. Also, reference numerals may be given to only some of a plurality of the same members and omitted from the other members.

Power Storage Module 10

As shown in FIG. 1, in the power storage module 10, the six power storage elements 12 are arranged side by side in the lengthwise direction (up-down direction in FIG. 1). The power storage elements 12 have a horizontally long rectangular parallelepiped shape, and the power storage module 10 increases the output voltage by connecting the six power storage elements 12 in series. The power storage elements 12 are not particularly limited, and may be secondary batteries or capacitors. The power storage elements 12 related to the present embodiment are secondary batteries. Lithium-ion secondary batteries, lithium polymer secondary batteries, nickel metal hydride batteries and the like can be used for the secondary batteries.

An electrode terminal 16 is formed on both the left and right end portions of the upper surface of each power storage element 12. One of the electrode terminals 16 is a positive electrode and the other is a negative electrode. A connecting bus bar 18 or an output bus bar 20 constituting a connecting member is electrically connected to each electrode terminal 16.

Connecting Bus Bar 18 and Output Bus Bar 20

The connecting bus bar 18 and the output bus bar 20 are formed by pressing a metal plate material into a predetermined shape. As for the metal constituting the connecting bus bar 18 and the output bus bar 20, a metal having high thermal conductivity and low electrical resistance such as copper, a copper alloy, aluminum and an aluminum alloy can be selected as appropriate. A plating layer not shown may be formed on the surface of the connecting bus bar 18 and the output bus bar 20. As for the metal constituting the plating layer, any suitable metal such as tin, nickel and solder can be selected.

As shown in FIG. 1, the connecting bus bar 18 connects adjacent electrode terminals 16 in a state of straddling the adjacent electrode terminals 16. The output bus bar 20 is connected to one electrode terminal 16 and outputs power to an external device not shown. There are two output bus bars 20 in the present embodiment, one connected to the electrode terminal 16 formed on the left end portion of the power storage element 12 in the last row, and one connected to the electrode terminal 16 formed on the left end portion of the power storage element 12 in the front row. In this embodiment, five connecting bus bars 18 connect adjacent electrode terminals 16. The plurality of power storage elements 12 are connected in series by these connecting bus bars 18. Note that the connecting bus bars 18, the output bus bars 20 and the electrode terminals 16 are electrically and physically connected by a known technique such as soldering, welding and bolting.

In FIG. 1, the numbers 0 to 6 given to the connecting bus bars 18 and the output bus bars 20 indicate the order of the respective potentials of the six storage elements 12 to which the connecting bus bars 18 and the output bus bars 20 are connected. The potential of the electrode terminal 16 connected to the output bus bar 20 numbered 0 is the lowest, and increases in order from 1 to 5, with the potential of the electrode terminal 16 connected to the output bus bar 20 numbered 6 being the highest. Incidentally, in the present embodiment, the conventional problem of it being difficult to arrange front surface wirings 30 described later in potential order is resolved.

As shown in FIG. 1, the numbers of the potentials of the electrode terminals 16 connected to the connecting bus bars 18 and the output bus bars 20 arranged on the left end portions of the six storage elements 12 lined up in the front-rear direction are 0, 2, 4 and 6. The numbers of the potentials of the electrode terminal 16 connected to the connecting bus bars 18 arranged on the right end portions of the six power storage elements 12 are 1, 3 and 5. In this way, the potentials of the electrode terminals 16 alternate between the left and right sides in ascending order.

Connector 22

A connector 22 is provided at the connecting end portion of the battery wiring module 14. The connector 22 is connected to an external device not shown that includes a circuit or microcomputer for use in voltage detection therein.

Battery Wiring Module 14

As shown in FIG. 1, the battery wiring module 14 is placed on the upper surface of the six power storage elements 12. The battery wiring module 14 according to the present embodiment includes a two-layer board 24 having flexibility and the connector 22 connected to the two-layer board 24.

Two-Layer Board 24

As shown in FIG. 1, the two-layer board 24 is a two-layer flexible printed circuit board in which wiring is formed by printed wiring technology on a front surface 26 and a back surface 28 of an insulating base film 44 having flexibility described later. The two-layer board 24 is formed to be long in the front-rear direction.

As shown in FIG. 1, a plurality of front surface wirings 30 (seven in the present embodiment) are formed on the front surface 26 of the two-layer board 24. The two front surface wirings 30 constituting voltage detection lines that are connected at one end to the connector 22 at positions numbered 0 and 6 are connected at the other end to the output bus bars 20. That is, the two-layer board 24 has two front surface wirings 30 for detecting the voltages of the power storage elements 12 via the two output bus bars 20. Note that the front surface wirings 30 and the output bus bars 20 are electrically and physically connected by any suitable technique such as soldering and welding.

The five front surface wirings 30 constituting voltage detection lines that are connected at one end to the connector 22 at positions numbered 1 to 5 are connected at the other end to front-back conduction parts 32. The front-back conduction parts 32 pass through the two-layer board 24 in the plate thickness direction (direction perpendicular to the page in FIG. 1), and connect the front surface wirings 30 with back surface wirings 34 constituting voltage detection lines formed on the back surface 28. The five back surface wirings 34 that are connected at one end to the front-back conduction parts 32 are respectively connected at the other end to the connecting bus bars 18 numbered 1 to 5. That is, the two-layer board 24 has five front surface wirings 30 and back surface wirings 34 for detecting the voltages of the six storage elements 12 via the five connecting bus bars 18. Note that the back surface wirings 34 and the connecting bus bars 18 are electrically and physically connected by any suitable technique such as soldering and welding.

Front-Back Conduction Part 32

As shown in FIG. 2, the front-back conduction part 32 is formed in a multilayer wiring region 36 where the front surface wiring 30 and the back surface wiring 34 overlap each other at one end portion in the lengthwise direction, in projection in the plate thickness direction (direction perpendicular to the page in FIG. 2) of the two-layer board 24. The front-back conduction part 32 is constituted by one via 43 consisting of a through hole 38 passing through this multilayer wiring region 36 in the plate thickness direction and a metal plating layer 42 adhered to a peripheral wall 40 of the through hole 38 to form a tubular shape. The upper and lower end sides of the front-back conduction part 32 in the plate thickness direction are respectively connected to the front surface wiring 30 and the back surface wiring 34. Constituting the front-back conduction part 32 with a via 43 enables manufacturing of the battery wiring module 14 of the present disclosure to be advantageously performed. As shown in FIG. 2, the front-back conduction part 32 has an elliptical shape whose long axis is in the lengthwise direction (left-right direction in FIG. 2) of the front surface wiring 30 and the back surface wiring 34. In the front-back conduction part 32, the metal plating layer 42 is formed thicker at both end portions in the lengthwise direction than at a central portion in the lengthwise direction. Also, by setting the long axis in the lengthwise direction, it becomes possible to secure a large cross-sectional area of the front-back conduction part 32 with respect to the front and back surface wirings 30 and 34 having a constant wiring width. The above configuration enables the resistance value per unit length of the front-back conduction part 32 to be advantageously reduced. Therefore, setting this resistance value to less than or equal to the maximum resistance value per unit length of the front surface wiring 30 and the back surface wiring 34 can be easily realized. Note that, in order to facilitate understanding, the boundary of the metal plating layer 42 is indicated with a virtual line.

Manufacturing Process of Front-Back Conduction Part 32

Next, the configuration of the front-back conduction part 32 will be described using an example of the manufacturing process of the front-back conduction part 32 in the battery wiring module 14 according to the present embodiment. The manufacturing process of the front-back conduction part 32 is not limited to the following description.

First, the manufacturing process of the front-back conduction part 32 will be described using FIGS. 3(*a*)-3(*c*).

(1) A double-sided copper-clad laminate 48 having a flexible insulating base film 44 made of polyimide or the like and a copper foil 46 affixed using an adhesive layer 45 to both surfaces of the insulating base film 44 is prepared.

(2) Next, the through hole 38 that passes through the double-sided copper-clad laminate 48 is formed by performing a process such as NC drilling or laser beam machining on the double-sided copper-clad laminate 48 (see FIG. 3(*a*)).

(3) Then, after desmearing and conductive treatment are performed on the peripheral wall 40 inside the through hole 38, plating (e.g., copper electroplating) is performed over the entire surface of the double-sided copper-clad laminate 48 in which the through hole 38 is formed. The metal plating layer 42 is thereby formed on the copper foil 46 and the peripheral wall 40 of the through hole 38, and the copper foil 46 formed on both surfaces of the insulating base film 44 is electrically connected.

(4) Next, the conductive films (metal plating layer 42 and copper foil 46) on both surfaces of the insulating base film 44 are processed into a predetermined pattern by a subtractive method (see FIG. 3(*b*)). More specifically, after forming a resist layer (not shown) such as a dry film resist so as to cover the metal plating layer 42 and the through hole 38, the resist layer is exposed and developed by a photofabrication technique to process the resist layer into a predetermined pattern. After forming the front surface wiring 30 and the back surface wiring 34 by etching the metal plating layer 42 and the copper foil 46 using the patterned resist layer as a mask, the resist layer is separated.

As a result of the processes described so far, the front surface wiring 30 and the back surface wiring 34 are respectively formed on the front surface 26 and the back surface 28 of the insulating base film 44, and the two-layer board 24 having the front-back conduction part 32 is produced, as shown in FIG. 3(*b*). Note that, in the above procedure, the plating process is performed after forming the through hole 38, but patterning of the copper foil 46 may be performed without performing this plating process.

(5) Finally, a cover lay 54 having an insulating film 50 made of a polyimide film or the like and an adhesive layer 52 formed on one surface of the insulating film 50 is prepared. The adhesive layer 52 is made of an adhesive such as an acrylic adhesive and an epoxy adhesive. In order to insulate and protect the front surface wiring 30 and the back surface wiring 34, the cover lay 54 is laminated on both surfaces of the two-layer board 24 using a vacuum laminator or the like. The front surface wiring 30, the back surface wiring 34 and the front-back conduction part 32 are thereby covered by the insulating film 50 that is overlaid thereon, as shown in FIG. 3(*c*). As a result, the front-back conduction part 32 can also be insulated and covered together with the front surface wiring 30 and the back surface wiring 34, and the occurrence of short circuits due to causes such as condensation on the front-back conduction part 32 can be prevented beforehand. This process completes the battery wiring module 14 shown in FIG. 1.

The front surface wiring 30 and the back surface wiring 34 are thus constituted to include the copper foil 46 constituting a metal base layer provided on both surfaces of the two-layer board 24 and the metal plating layer 42 constituting a surface layer provided on the copper foil 46. The metal plating layer 42 can thereby be formed not only on the peripheral wall 40 of the through hole 38 but also on the surface layer of the front surface wiring 30 and the back surface wiring 34 at the same time, and improvement in manufacturing efficiency can be achieved. Also, in the present embodiment, the thickness dimension of the metal plating layer 42 is 18 µm and the thickness dimension of the copper foil 46 is 15 µm, with the thickness dimension of the metal plating layer 42 being larger than the thickness dimension of the copper foil 46. A large thickness dimension of the metal plating layer 42 of the via 43 can thereby be secured. Moreover, given that the front-back conduction part 32 has an elliptical shape whose long axis is in the lengthwise direction, the metal plating layer 42 is formed thickly at both ends in the lengthwise direction, and the peripheral wall 40 constituting the front-back conduction part 32 is elongated in the lengthwise direction. Therefore, the resistance value per unit length of the front-back conduction parts 32 is reduced, and setting this resistance value to less than or equal to the maximum resistance value per unit length of the front surface wiring 30 and the back surface wiring 34 is advantageously realized. Note that the maximum resistance value here refers to the resistance value of wiring configuration portions of the wirings, and does not include current limiting regions such as chip fuses or positive temperature coefficient thermistors intermediately positioned in the wirings.

The battery wiring module 14 of the present disclosure having such a structure includes the front-back conduction parts 32 passing through the two-layer board 24 in the plate thickness direction and connecting the front surface wirings 30 and the back surface wirings 34. The order in which the plurality of front surface wirings 30 are arranged at the connector 22 that is connected to an external device can thereby be easily changed to potential order, for example. Moreover, setting the resistance value per unit length of the front-back conduction parts 32 to less than or equal to the maximum resistance value per unit length of the front surface wirings 30 and the back surface wirings 34 is advantageously realized. Short circuits and problems such as unexpected circuit breaks of the front surface wirings 30 and the back surface wirings 34 occurring in the front-back conduction parts 32 are thereby prevented beforehand. Therefore, the degree of freedom in routing of the voltage detection lines constituted by the front surface wirings 30 and the back surface wirings 34 which are printed wirings of the two-layer board 24 constituting a flexible printed circuit board can be improved without the accompanying problem of short circuits that arises in the case where jumper wires are used.

OTHER EMBODIMENTS

The technologies described herein are not limited to the embodiments illustrated in the above description and drawings, and embodiments such as the following, for example, are also included in the technical scope of the technologies described herein.

(1) In the above first embodiment, the front-back conduction part 32 is constituted by one via 43, but the disclosure is not limited thereto. For example, as with a front-back conduction part 56 of a second embodiment shown in FIG. 5, the front-back conduction part may be constituted by two vias 43 arranged adjacently in the lengthwise direction. Alternatively, as with a front-back conduction part 58 of a third embodiment shown in FIG. 6, the front-back conduction part may be constituted by four vias 43 arranged adjacently in the lengthwise and widthwise directions. The front-back conduction parts 56 and 58 whose resistance value per unit length is less than or equal to the maximum resistance value per unit length of the front surface wirings 30 and the back surface wirings 34 can thereby be realized without increasing the plating thickness of the vias 43. Therefore, the front-back conduction parts 56 and 58 with lower conduction resistance can be provided at lower cost.

Figure 5:
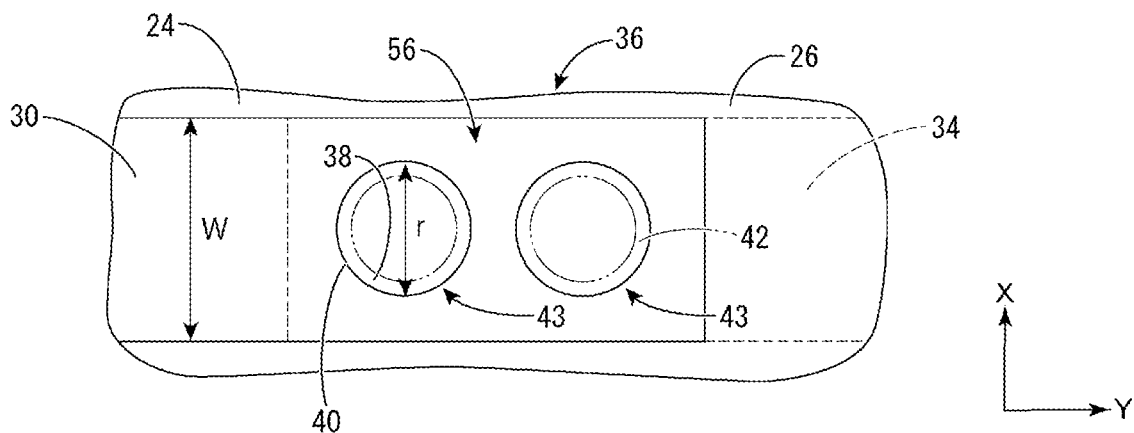
FIG. 5 is an enlarged plan view showing a front-back conduction part of a battery wiring module according to a second embodiment.
Figure 6:
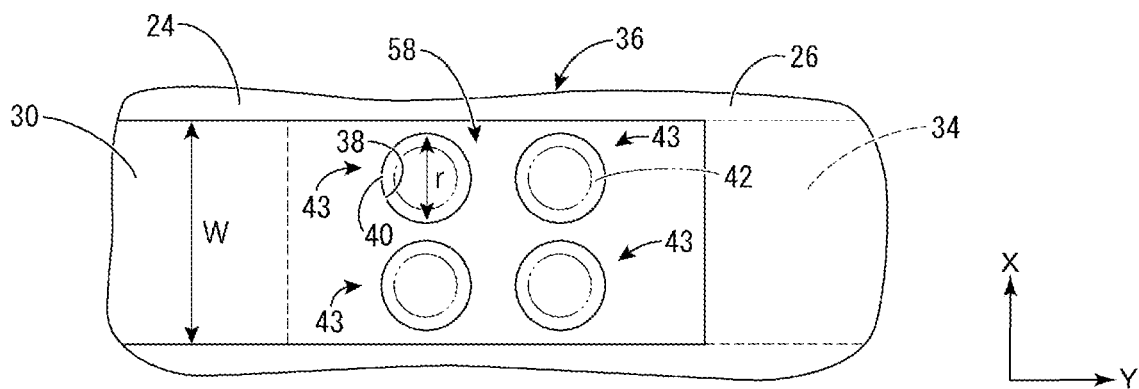
FIG. 6 is an enlarged plan view showing a front-back conduction part of a battery wiring module according to a third embodiment.
Figure 7:
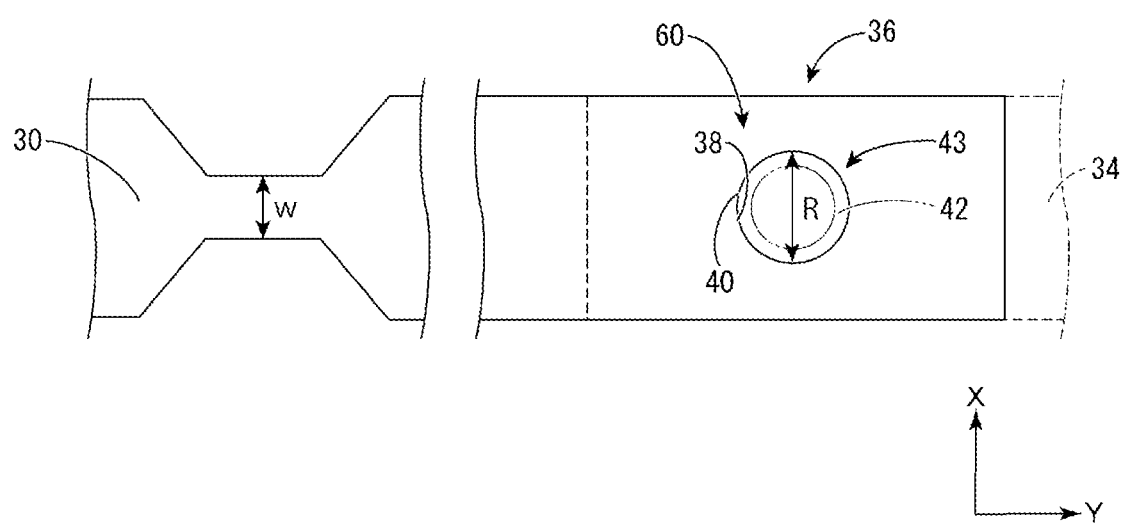
FIG. 7 is an enlarged plan view showing a front-back conduction part of a battery wiring module according to a fourth embodiment.

(2) In the above first, second and third embodiments, as shown in FIGS. 2, 5 and 6, a widthwise hole diameter r of the through hole 38 constituting the via 43 is smaller than a minimum wiring width dimension W of the front surface wiring 30 and the back surface wiring 34, but the disclosure is not limited thereto. For example, as with a front-back conduction part 60 of a fourth embodiment shown in FIG. 7, the widthwise hole diameter R of the through hole 38 constituting the via 43 may be larger than the minimum wiring width dimension W of the front surface wiring 30 and the back surface wiring 34. The cross-sectional area of the metal plating layer 42 of the via 43 can thereby be advantageously increased relative to in regions of the front surface wiring 30 and the back surface wiring 34 having the minimum wiring width dimension. Therefore, setting the resistance value per unit length of the front-back conduction part 60 to less than or equal to the maximum resistance value per unit length in the front surface wiring 30 and the back surface wiring 34 can be advantageously realized. Note that, in order to facilitate understanding, depiction of the two-layer board 24 is omitted in FIG. 7.

(3) In the above first, second, third and fourth embodiments, the front-back conduction parts 32, 56, 58 and 60 are conductively connected the front surface wiring 30 and the back surface wiring 34 by the metal plating layer 42 adhered to the peripheral wall 40 of the through hole 38, but the disclosure is not limited thereto. For example, the front surface wiring 30 and the back surface wiring 34 may be conductively connected by the through hole 38 being filled with solder.

(4) In the above first, second, third and fourth embodiments, one battery wiring module 14 arranged on a plurality of power storage elements 12 is described as an example, but the disclosure is not limited thereto. The present disclosure can also be applied to two battery wiring modules 14 respectively arranged on one side and the other side of the plurality of power storage elements 12. In this case, arranging the front surface wirings 30 in potential order is no longer an issue, and resistance adjustment parts that are connected to the voltage detection lines being constituted by the back surface wirings 34, for example, enables the difference in electrical resistance of voltage detection lines of various wiring lengths that is described in Patent Document 1 to be easily eliminated. Improvement in the degree of freedom in routing of voltage detection lines constituted by printed wirings of a flexible printed circuit board can thereby be achieved.

LIST OF REFERENCE NUMERALS

10 Power storage module
12 Power storage element
14 Battery wiring module
16 Electrode terminal
18 Connecting bus bar (connecting member)
20 Output bus bar (connecting member)
22 Connector
24 Two-layer board (flexible printed circuit board)
26 Front surface
28 Back surface
30 Front surface wiring (voltage detection line)
32 Front-back conduction part
34 Back surface wiring (voltage detection line)
36 Multilayer wiring region
38 Through hole
40 Peripheral wall
42 Metal plating layer
43 Via
44 Insulating base film
45 Adhesive layer
46 Copper foil
48 Double-sided copper-clad laminate
50 Insulating film
52 Adhesive layer
54 Cover lay
56 Front-back conduction part
58 Front-back conduction part
60 Front-back conduction part

The invention claimed is:

1. A battery wiring module to be arranged on a plurality of power storage elements each having an electrode terminal, comprising:
   a plurality of connecting members to be connected to the electrode terminals; and
   a flexible printed circuit board having a plurality of voltage detection lines for detecting voltages of the plurality of power storage elements via the plurality of connecting members,
   wherein at least one of the plurality of voltage detection lines includes a front surface wiring and a back surface wiring respectively formed on a front surface and a back surface of the flexible printed circuit board, and a front-back conduction part passing through the flexible printed circuit board in a plate thickness direction and connecting the front surface wiring and the back surface wiring,
   wherein the front-back conduction part includes:
      at least one via consisting of a through hole passing through a multilayer wiring region where the front surface wiring and the back surface wiring overlap each other in projection in the plate thickness direction of the flexible printed circuit board, and a metal plating layer adhered to a peripheral wall of the through hole to form a continuous electrical tubular shape and respectively connected, on an upper end side and a lower end side, to the front surface wiring and the back surface wiring, wherein the through hole has the continuous electrical tubular shape whose long axis is in a lengthwise direction of the front surface wiring and the back surface wiring, and wherein the metal plating layer is thicker at both ends of the through hole in the lengthwise direction, such that a resistance value per unit length of the front-back conduction part is less than or equal to a maximum resistance value per unit length of the front surface wiring and the back surface wiring.

2. The battery wiring module according to claim 1, wherein the front-back conduction part is constituted by a plurality of the via adjacently disposed.

3. The battery wiring module as according to claim 1, wherein a hole diameter of the through hole constituting the via is larger than a minimum wiring width dimension of the front surface wiring and the back surface wiring.

4. The battery wiring module according to claim 1, wherein the front surface wiring and the back surface wiring include a metal base layer provided on the flexible printed circuit board and a surface layer provided on the base layer, the surface layer being formed by plating at a same time as the metal plating layer provided by being adhered to the peripheral wall of the through hole constituting the via, and a thickness dimension of the surface layer being larger than a thickness dimension of the base layer.

5. The battery wiring module according to claim 1, wherein the front surface wiring, the back surface wiring and the front-back conduction part are covered by an insulating film overlaid thereon.

* * * * *